(12) United States Patent
Tsuji et al.

(10) Patent No.: US 6,514,668 B1
(45) Date of Patent: Feb. 4, 2003

(54) PHOTOSENSITIVE LITHOGRAPHIC PRINTING PLATE

(75) Inventors: Shigeo Tsuji, Yokohama (JP); Hideaki Okamoto, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 571 days.

(21) Appl. No.: 08/997,373

(22) Filed: Dec. 23, 1997

(30) Foreign Application Priority Data

Dec. 26, 1996 (JP) .............................................. 8-347531
May 12, 1997 (JP) .............................................. 9-120746

(51) Int. Cl.⁷ ................................................. G03F 7/09
(52) U.S. Cl. ................................. 430/278.1; 430/285.1; 430/287.1; 430/283.1; 430/284.1; 101/453; 101/454; 101/457
(58) Field of Search .......................... 430/278.1, 285.1, 430/287.1, 283.1, 284.1; 101/453, 454, 457

(56) References Cited

U.S. PATENT DOCUMENTS

| | | | |
|---|---|---|---|
| 4,039,722 A | | 8/1977 | Dickie et al. |
| 4,438,190 A | * | 3/1984 | Ishimaru et al. ............ 430/281 |
| 4,511,645 A | | 4/1985 | Koike et al. |
| 4,555,473 A | * | 11/1985 | Duebar et al. .............. 430/281 |
| 4,687,727 A | | 8/1987 | Toyama et al. |
| 5,104,743 A | * | 4/1992 | Nishikawa et al. ....... 428/472.2 |
| 5,153,095 A | | 10/1992 | Kawamura et al. |
| 5,262,278 A | | 11/1993 | Lauke et al. |
| 5,286,611 A | * | 2/1994 | Meir et al. ................... 430/325 |
| 5,800,965 A | * | 9/1998 | Tsuji et al. ............... 430/287.1 |

FOREIGN PATENT DOCUMENTS

| | | |
|---|---|---|
| EP | 0 496 203 | 7/1992 |
| EP | 0 678 785 | 10/1995 |
| GB | 1 378 072 | 12/1974 |
| JP | 49-17874 | 5/1974 |
| JP | 49-34041 | 9/1974 |
| JP | 50-100120 | 8/1975 |
| JP | 53-67507 | 6/1978 |
| JP | 62-6253 | 1/1987 |
| JP | 63-257749 | 10/1988 |

OTHER PUBLICATIONS

Database WPI, Derwent Publications, AN 78–53971, JP 53–067507, Jun. 16, 1978.

* cited by examiner

*Primary Examiner*—Janet Baxter
*Assistant Examiner*—Yvette M. Clarke
(74) *Attorney, Agent, or Firm*—Oblon, Spivak, McClelland, Maier & Neustadt, P.C.

(57) ABSTRACT

A photosensitive lithographic printing plate having a photosensitive resin layer formed on an aluminum substrate subjected to electrolytic surface roughening in nitric acid or in an electrolyte composed mainly of nitric acid and further to anodic oxidation treatment, wherein the photosensitive resin layer is made of a photopolymerizable composition comprising (A) an addition-polymerizable ethylenically unsaturated bond-containing monomer, (B) a photopolymerization initiator, and (C) a polymer binder, wherein the addition-polymerizable ethylenically unsaturated bond-containing monomer (A) contains a phosphate compound having at least one (meth)acryloyl group.

4 Claims, No Drawings

PHOTOSENSITIVE LITHOGRAPHIC PRINTING PLATE

The present invention relates to a photosensitive lithographic printing plate. Particularly, it relates to a photosensitive lithographic printing plate which is highly sensitive to light rays in a visible light region and which is excellent in developability and adhesion to a support.

In recent years, highly sensitive sensitized materials employing photopolymerizable photosensitive materials have been studied in various application fields. Among them, as a prospective system for practical application in near future, development of a highly sensitive photopolymer system which is useful for direct plate making by laser and which is suitable for exposure with a light having a wavelength of laser, such as 488 nm of argon ion laser or 532 nm of YAG laser, is desired, and various proposals for such system have been made.

However, such a photopolymer is poor in adhesion to an aluminum support, whereby there has been a problem that the image is likely to peel during development, or the printing resistance tends to be extremely low during printing.

Various studies have been made with respect to the support in order to improve the adhesion of the photosensitive layer. An aluminum support which has been commonly used as a support for a photosensitive lithographic printing plate, is usually subjected to surface roughening (graining) by e.g. mechanical polishing, chemical etching or electrolytic etching to improve the water holding property for wetting water during printing or to improve the adhesion to a photosensitive layer to be formed thereon. The surface structure of the grained aluminum plate contributes substantially to the plate making performance or the printing performance as a printing plate, and it is very important to control the surface structure. For example, for a support of a printing plate for a correction machine for which excellent image reproducibility and resolution are required, a grain structure is suitable wherein relatively fine shallow dents (pits) are densely present. On the other hand, for a support of a printing plate for the main printing machine for which excellent water holding property and high printing resistance are required, a grain structure is suitable wherein pits are uniform (microscopically uniform) in their diameters and relatively deep.

As grain treatment, an electrolytic etching treatment has been mainly used in recent years, since it is thereby possible to form a wide range of grain structures ranging from a relatively fine shallow grain structure to a deep uniform grain structure, as compared with a mechanical polishing method (such as ball polishing or brush polishing) or a chemical etching method. In an electrolytic etching method, graining is usually carried out by dipping an aluminum plate in a proper electrolyte solution and electrolyzing it by alternate current or direct current.

As the electrolyte, hydrochloric acid has been most commonly employed. However, if electrolytic etching is carried out by using hydrochloric acid as an electrolyte, it is hardly possible to obtain a grain which is deep and uniform in the microscopic structure (the structure as observed with a magnification of from 1,000 to 1,200 times by e.g. a microscope). Accordingly, when used as a support for a printing plate for the main printing machine, it has not been necessarily satisfactory with respect to the printing resistance or the adhesion of the photosensitive layer at the image portion, although the water holding property, and removability of the photosensitive layer at a portion which corresponds to a non-image portion, at the time of development, may be excellent.

On the other hand, JP-A-53-67507 discloses a method for electrolytic surface roughening treatment in an electrolytic bath of nitric acid type. By this method, a deep grain structure with a uniform pit diameter can be obtained, and it is possible to obtain a support excellent in adhesion of a photosensitive layer.

However, when a photopolymer is coated as a photosensitive layer on the support thus obtained, removability of the photosensitive layer at a non-image portion tends to be extremely low, although the adhesion of the photosensitive layer to the support may be improved. Accordingly, a residual film remains, and when such a plate is used as a printing plate, the non-image portion is likely to be inked, thus leading to a stain on a paper.

On the other hand, as an attempt to improve the adhesion from the photosensitive layer side, JP-A-50-100120 discloses that an addition-polymerizable unsaturated bond-containing phosphate such as 2-methacryloyloxyethyldihydrodiene phosphate, adheres well to a metal such as aluminum, iron or antimony. However, with such a phosphate monomer alone, the density of the cured film tends to be relatively small, so that the image portion is likely to be readily eroded, for example, by alkaline water, and fine lines or dots are likely to be eroded during development, whereby the image reproducibility tends to be poor. Further, at a non-image portion, the adhesion of the phosphate to the metal is rather high, whereby a residual film tends to remain, thus leading to a stain.

Further, JP-A-5-25232 discloses an example of a photosensitive lithographic printing plate having coated on hydrochloric acid EE grain (grain formed by electrolytic etching in a hydrochloric acid solution), a photopolymerizable composition comprising a phosphate compound having at least one unsaturated bond and a compound having a part of carboxyl groups of a polymer binder reacted with glycidyl methacrylate. However, also in this case, the printing resistance and the image reproducibility are not yet adequate.

It is an object of the present invention to provide a photosensitive lithographic printing plate which is excellent in various printing properties such as printing resistance, sensitivity, image reproducibility and removability of a non-image portion.

The present inventors have conducted an extensive study to solve the above problems of the prior art and as a result, have unexpectedly found that by a combination of nitric acid EE grain (an aluminum support subjected to electrolytic surface roughening in nitric acid or in an electrolyte composed mainly of nitric acid) and a polymerizable composition containing a phosphate compound, both of which have been believed to be inferior in the removability of a non-image portion, it is possible to obtain a photosensitive lithographic printing plate excellent in all of printing resistance, sensitivity, image reproducibility and removability of a non-image portion. The present invention has been accomplished on the basis of this discovery.

That is, the present invention provides a photosensitive lithographic printing plate having a photosensitive resin layer formed on an aluminum substrate subjected to electrolytic surface roughening in nitric acid or in an electrolyte composed mainly of nitric acid and further to anodic oxidation treatment, wherein the photosensitive resin layer is made of a photopolymerizable composition comprising (A) an addition-polymerizable ethylenically unsaturated bond-containing monomer, (B) a photopolymerization initiator, and (C) a polymer binder, wherein the addition-polymerizable ethylenically unsaturated bond-containing monomer (A) contains a phosphate compound having at least one (meth)acryloyl group.

Now, the present invention will be described in detail with reference to the preferred embodiments.

The addition-polymerizable ethylenically unsaturated bond-containing monomer (A) (hereinafter referred to simply as "an ethylenic monomer") contained as a first essential component in the photopolymerizable composition of the present invention, is a monomer having an ethylenically unsaturated bond which undergoes addition polymerization and cures by an action of a photopolymerization initiator as a second essential component when the photopolymerizable composition is irradiated with active light rays. In the present invention, the term "monomer" is meant for a concept as opposed to a so-called polymer, and accordingly, it includes not only a monomer in a narrow sense, but also a dimer, a trimer and an oligomer.

Particularly, the ethylenic monomer to be used in the present invention is characterized in that it contains a phosphate compound having at least one (meth)acryloyl group.

The phosphate compound having at least one (meth)acryloyl group is not particularly limited so long as it is an esterified product of phosphoric acid and a (meth)acryloyl group-containing compound. Specifically, it may, for example, be a compound of the following formula (1A):

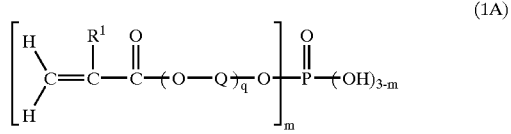

wherein $R^1$ is a hydrogen atom or an alkyl group, Q is an alkylene group, q is an integer of from 1 to 10, and m is 1 or 2.

In the compound of the formula (1A), $R^1$ is preferably a hydrogen or a $C_{1-4}$ alkyl group, more preferably a hydrogen or a methyl group, Q is preferably a $C_{1-10}$ alkylene group, and q is preferably from 1 to 5.

As a preferred phosphate compound, a compound of the following formula (1B) may be mentioned:

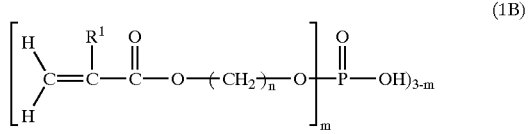

wherein $R^1$ is a hydrogen atom or a methyl group, n is an integer of from 1 to 25, and m is 1 or 2.

Particularly preferred is a compound of the formula (1B) wherein n is from 1 to 10, from the viewpoint of improvement of the printing resistance and removability of a non-image portion. Specific examples of the particularly preferred compound among compounds of the formula (1B) include methacryloxyethyl phosphate and bis (methacryloxyethyl) phosphate.

The content of the phosphate compound to be used in the present invention is usually from 1 to 60 wt %, preferably from 2 to 50 wt %, in the total ethylene compound. If the content is less than 1 wt %, the adhesion to the support and the developability tend to be poor, and if it exceeds 60 wt %, the sensitivity tends to be poor. The phosphate compound having at least one (meth)acryloyl group contained in the composition of the present invention may be a single compound or a mixture of a plurality of compounds.

Within the above range, not only the sensitivity and printing resistance, but also the removability of a non-image portion, will be improved. The composition of the present invention may contain a compound having one ethylenically unsaturated bond as an ethylenic monomer other than the phosphate compound having at least one (meth)acryloyl group. Specifically, it may, for example, be (meth)acrylic acid, an alkyl ester of (meth)acrylic acid, acrylonitrile, styrene, or a monoester of a polyhydric (monohydric) alcohol with a carboxylic acid having one ethylenically unsaturated bond.

In the present invention, it is preferred to use a polyfunctional ethylenic monomer having two or more ethylenically unsaturated bonds in one molecule together with the phosphate compound having at least one (meth)acryloyl group.

Examples of such a polyfunctional ethylenic monomer include an ester of an aliphatic polyhydroxy compound with an unsaturated carboxylic acid; an ester of an aromatic polyhydroxy compound with an unsaturated carboxylic acid; and an ester obtained by an esterification reaction of a polyhydroxy compound such as an aliphatic polyhydroxy compound or an aromatic polyhydroxy compound, with an unsaturated carboxylic acid and a polybasic carboxylic acid. The above ester of an aliphatic polyhydroxy compound with an unsaturated carboxylic acid is not particularly limited, and it may, for example, be an acrylate of an aliphatic polyhydroxy compound such as ethylene glycol diacrylate, triethylene glycol diacrylate, trimethylolpropane triacrylate, trimethylolethane triacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate or glycerol acrylate, or a methacrylate having "acrylate" in such an exemplified compound replaced by "methacrylate, an itaconate having "acrylate" likewise replaced by "itaconate", a crotonate having "acrylate" likewise replaced by "crotonate", or a maleate having "acrylate" likewise replaced by maleate".

The ester of an aromatic polyhydroxy compound with an unsaturated carboxylic acid may, for example, be an acrylate or methacrylate of an aromatic polyhydroxy compound, such as hydroquinone diacrylate, hydroquinone dimethacrylate, resorcinol diacrylate, resorcinol dimethacrylate or pyrogallol triacrylate. The ester obtainable by an esterification reaction of a polyhydoxy compound with an unsaturated carboxylic and and a polybasic carboxylic acid, may not necessarily be a single compound. A typical specific example may be a condensation product of acrylic acid, phthalic acid and ethylene glycol, a condensation product of acrylic acid, maleic acid and ethylene glycol, a condensation product of methacrylic acid, terephthalic acid and pentaerythritol, or a condensation product of acrylic acid, adipic acid, butanediol and glycerol.

Other examples of the polyfunctional ethylenic monomer to be used in the present invention include urethane (meth) acrylates obtainable by reacting a polyisocyanate compound with a hydroxyl group-containing (meth)acrylate, or a polyisocyanate compound with a polyol and a hydroxyl group-containing (meth)acrylate; epoxy acrylates, such as an addition reaction product of a polyvalent epoxy compound with hydroxy (meth)acrylate or (meth)acrylic acid; acrylamides such as ethylenebisacrylamide; allyl esters such as diallyl phthalate; and vinyl group-containing compounds such as divinyl phthalate.

Among these polyfunctional ethylenic monomers, preferred is one which contains an urethane (meth)acrylate as an essential component.

As the polyisocyanate compounds to be used for the preparation of the above urethane (meth)acrylates, various polyisocyanate compounds known as starting materials for polyurethanes, can be used, including aromatic diisocyanates, alicyclic diisocyanates, aliphatic diisocyanate compounds and their derivatives such as their trimers. More preferably, diphenylmethane diisocyanate, tolylene diisocyanate, xylylene diisocyanate, hexamethylene diisocyanate, trimethylhexamethylene diisocyanate, isophorone diisocyanate, cyclohexane diisocyanate and isocyanurate compounds may, for example, be mentioned.

The hydroxyl group-containing (meth)acrylate to be reacted with the polyisocyanate compound, is preferably a compound having a plurality of acryloyl groups or methacryloyl groups and having one hydroxyl group. Specifically, it may, for example, be a reaction product of glycidyl (meth)acrylate with (meth)acrylic acid, or pentaerythritol tri(meth)acrylate. When such a urethane (meth) acrylate is used as the ethylenic monomer component, it is used usually in an amount of from 20 to 70 wt %, preferably from 30 to 60 wt %, based on the entire ethylenic monomer.

Now, the photopolymerization initiator (B) as the second essential component of the photopolymerizable composition of the present invention will be described. As the photopolymerization initiator, any initiator may be used so long as it is capable of initiating the polymerization of the above-mentioned ethylenic monomer. Particularly any initiator may suitably be used so long as it has sensitivity to light rays in the visible light region. More particularly, as an active agent which forms active radicals by some interaction with a sensitizer excited by light, a titanocene, a hexaarylbiimidazole, a halogenated hydrocarbon derivative, a diaryliodonium salt or an organic peroxide, may, for example, be mentioned. A composition employing a titanocene or a hexaarylbiimidazole, is particularly preferred, as the sensitivity, the storage stability and the adhesion of the coated film to the substrate, are good.

As the titanocene, various compounds having a titanocene structure may be employed. For example, it may be selected for use from various titanocenes as disclosed in e.g. JP-A-59-152396 and JP-A-61-151197.

Specifically, it may, for example, be dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-2,6-difluorophen-1-yl, dicyclopentadienyl-Ti-bis-2,4-dfluorophen-1-yl, dimethylcyclopentadienyl-Ti-bis-2,3,4,5,6-15 pentafluorophen-1-yl, dimethylcyclopentadienyl-Ti-bis-2,6-difluorophen-1-yl, or dicyclopentadienyl-Ti-bis(2,6-difluoro-3-(pyl-1-yl)-phen-1-yl.

As the hexaacrylbiimidazole, various compounds having a hexaarylbiimidazole structure may be used. For example, it is preferably a hexaarylbiimidazole having a halogen substituent on a benzene ring, such as 2,2'-bis(o-chlorophenyl)-4,4, 5,5'-tetra(p-fluorophenyl)biimidazole, 2,2'-bis(o-bromophenyl)-4,4',5,5'-tetra(p-iodophenyl) biimidazole, 2,2'-bis(o-chlorophenyl)-4,4', 5,5'-tetra(p-chloronaphthyl)biimidazole, 2,2'-bis(o-chlorophenyl)-4,4', 5,5'-tetra(p-chlorophenyl)biimidazole, 2,2'-bis(o-bromophenyl) 4,4',5,5'-tetra(p-chloro-p-methoxyphenyl) biimidazole, 2,2'-bis(o-chlorophenyl)-4,4',5,5'-tetra(o,p-dichlorophenyl)biimidazole, 2,2'-bis(o-chlorophenyl)-4,4', 5,5'-tetra(o,p-dibromophenyl) biimidazole, 2,2'-bis(o-bromophenyl)-4,4', 5,5'-tetra(o,p-dichlorophenyl) biimidazole, or 2,2'-bis(o,p-dichlorophenyl)-4,4',5,5'-tetra (o,p-dichloropyneyl)biimidazole.

Such hexaarylbiimidazoles may be used in combination with a plurality of biimidazoles, as the case requires. The biimidazoles may easily be produced by a method disclosed in e.g. Bull. Chem. Soc. Japan, 33,565 (1960) and J. Org. Chem. 36(16)2262 (1971).

Now, among photopolymerization initiators, a sensitizing agent will be described. In the present invention, the sensitizing agent is meant for a compound which is capable of effectively forming active radicals under irradiation with visible light rays, when it is coexistent with the above-mentioned active agent.

Typical examples of the sensitizing agent include triphenylmethane type leuco dyes such as leuco crystal violet and leuco malachite green, and photoreducible dyes such as erythrosine and eosine Y, as disclosed in U.S. Pat. No. 3,479,185, aminophenylketones such as Michler's ketone and aminostyrylketone, as disclosed in U.S. Pat. Nos. 3,549, 367 and 3,652,275, β-diketones, as disclosed in U.S Pat. No. 3,844,790, indanones, as disclosed in U.S. Pat. No. 4,162, 162, ketocumalins, as disclosed in JP-A-52-112681, aminostyrene derivatives and aminophenylbutadiene derivatives, as disclosed in JP-A-59-56403, aminophenyl heterocyclic compound, as disclosed in U.S. Pat. No. 4,594, 310, julolidine heterocyclic compounds, as disclosed in U.S. Pat. No. 4,966,830 and pyrometene type dyes, as disclosed in JP-A-5-241338.

Further, it is possible to further increase the photopolymerization initiating ability by adding a hydrogen-donating compound such as 2-mercaptobenzothiazole, 2-mercaptobenzimidazole, 2-mercaptobenzoxazole, 3-mercapto-1,2,4-triazole, N-phenylglycine or an N,N-dialkylbenzoic acid alkyl ester, to the photopolymerization initiator to be used in the present invention, as the case requires. Among them, particularly preferred is a compound having a mercapto group, such 2-mercaptobenzothiazole, 2-mercaptobenzimidazole, 2-mercaptobenzoxazole or 3-mercapto-1,2,4-triazole, or an alkyl N,N-dialkylbenzoate.

Now, the polymer binder (C) as the third essential component of the present invention will be described.

The polymer binder to be used in the present invention may suitably be selected for use from known polymer binders taking the developing method into consideration. An alkali soluble polymer binder, especially, a polymer binder having carboxyl groups in its molecule, is preferably employed. Specifically, the polymer binder having carboxyl groups in its molecule may, for example, be a homopolymer or copolymer of e.g. (meth)acrylic acid, a (meth)acrylate, a (meth)acrylamide, maleic acid, a (meth)acrylonitrile, styrene, vinyl acetate, vinylidene chloride or maleimide, or others such as polyethylene oxide, polyvinyl pyrrolidone, polyamide, polyurethane, polyester, polyether, polyethylene terephthalate, acetylcellulose or polyvinylbutyral. Particularly preferred is a copolymer comprising, as copolymer components, at least one (meth)acrylate and (meth)acrylic acid. A preferred acid value of the polymer binder having carboxyl groups in its molecule is from 10 to 250, and a preferred weight average molecular weight (hereinafter referred to simply as Mw) is from 5,000 to 500,000.

Such a polymer binder is preferably one having unsaturated bonds in its side chains, particularly one having at least one type of unsaturated bonds of the following formulae (2) to (4):

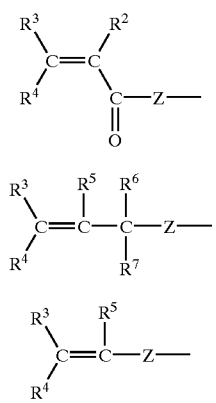

wherein $R^2$ is a hydrogen atom or a methyl group, each of $R^3$ to $R^7$ which are independent of one another, is a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, or an arylsulfonyl group which may have a substituent, and Z is a n oxygen atom, a sulfur atom, an imino group or an alkylimino group.

The substituent for e.g. the alkyl group which may have a substituent, is not particularly limited so long as it does not extremely lower the reactivity of the carbon-carbon double bond, and it is usually selected from a halogen atom, an alkyl group, a phenyl group, a cyano group, a nitro group, an alkoxy group, an alkylthio group and a dialkylamino group.

Among them, preferred is a group of the formula (2) wherein $R^2$ is a hydrogen atom or a methyl group, and each of $R^3$ and $R^4$ which are independent of each other, is a hydrogen atom, a lower alkyl group, an alkoxy group, a dialkylamino group or a cyano group, a group of the formula (3) wherein each of $R^3$ and $R^4$ which are independent of each other, is a hydrogen atom, a halogen atom, a lower alkyl group, a carboxyl group, an alkoxycarbonyl group or a cyano group, and $R^5$ is a hydrogen atom, a lower alkyl group, a carboxyl group, an alkoxycarbonyl group or a cyano group, and each of $R^6$ and $R^7$ which are independent of each other, is a hydrogen atom, a halogen atom or a lower alkyl group, or a group of the formula (4) wherein each of $R^3$, $R^4$ and $R^5$ which are independent of one another, is a hydrogen atom, a halogen atom, a lower alkyl group, a carboxyl group, an alkoxycarbonyl group or a cyano group. Particularly preferred from the viewpoint of efficiency in the addition reaction of the carbon-carbon double bond in the above formulae (2) to (4), are a group of the formula (2) wherein at least two among $R^2$ to $R^4$ are hydrogen atoms, or a group of the formula (3) or (4), wherein at least two of $R^3$ to $R^5$ are hydrogen atoms.

Syntheses of these compounds may be generally classified into the following two methods.

Synthesis 1

A solution of the polymer binder having carboxyl groups in its molecule in an inert organic solvent (such as an alcohol type, ester type, aromatic hydrocarbon type or aliphatic hydrocarbon type solvent) and an epoxy group-containing unsaturated compound are reacted at a temperature of from 80 to 120° C. for from 1 to 50 hours. The proportion of carboxyl groups to be reacted with the epoxy group-containing unsaturated compound is not particularly limited so long as it is within a range where the effects of the present invention can be accomplished. It is preferred that from 5 to 90 mol %, more preferably from 20 to 80 mol %, most preferably from 30 to 70 mol %, of the total carboxyl groups are reacted. Within such a range, the developability will be good, and the adhesion will also be good.

The epoxy group-containing unsaturated compound to be used for the preparation of the ethylenic polymer binder having unsaturated groups in its side chains, is a compound having at least one addition-polymerizable unsaturated bond and an epoxy group in one molecule.

The epoxy group-containing unsaturated compound may, for example, be an aliphatic epoxy group-containing unsaturated compound, such as glycidyl (meth)acrylate, allylglycidyl ether, α-ethylglycidyl acrylate, crotonylglycidyl ether, glycidyl crotonate, an itaconic acid monoalkylester monoglycidyl ester, a fumaric acid monoalkylester monoglycidyl ester, or a maleic acid monoalkylester monoglycidyl ester, or alicyclic epoxy group-containing unsaturated compounds of the following formulae:

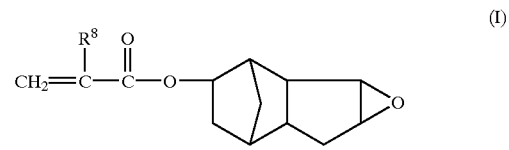

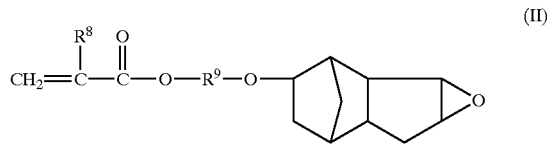

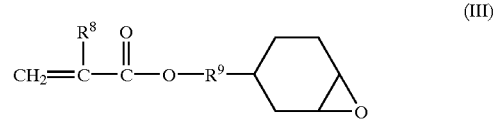

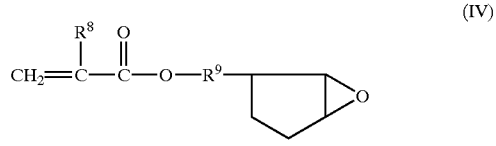

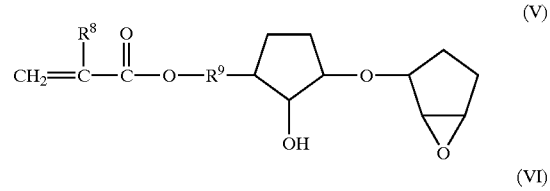

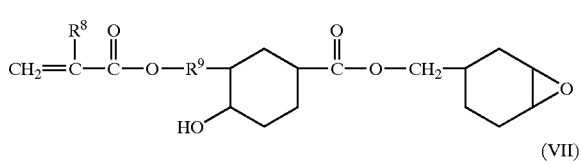

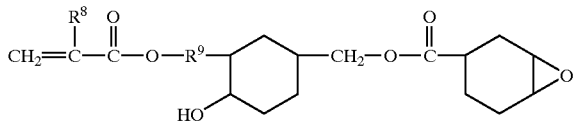

-continued

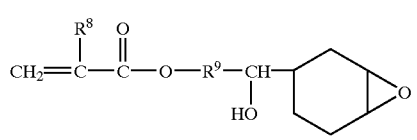
(VIII)

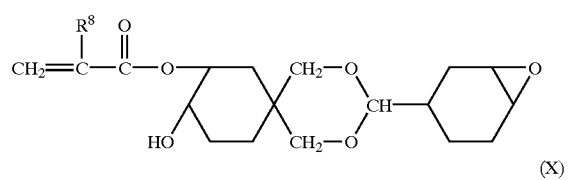
(IX)

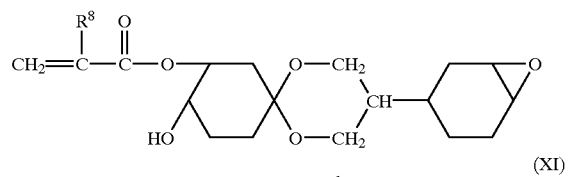
(X)

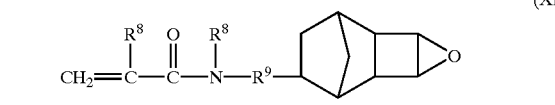
(XI)

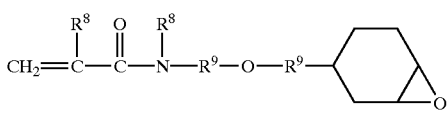
(XII)

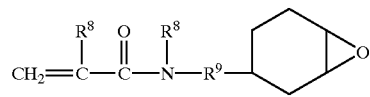
(XIII)

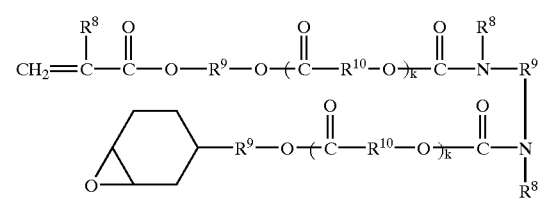
(XIV)

In the above formulae, $R^8$ is a hydrogen atom or a methyl group, $R^9$ is a $C_{1-6}$ bivalent aliphatic saturated hydrocarbon group, $R^{10}$ is a $C_{1-10}$ bivalent hydrocarbon group, and k is an integer of from 0 to 10.

Preferred specific examples of the above epoxy group-containing unsaturated compound include glycidyl methacrylate, allylglycidyl ether, and 3,4-epoxycyclohexylmethyl acrylate. Particularly preferred among them is allylglycidyl ether or 3,4-epoxycyclohexylmethyl acrylate.

Synthesis 2

A method in which a compound having a total of at least two unsaturated bonds comprising at least one unsaturated bond having a low reactivity, as shown by the above formula (3) or (4) and one unsaturated bond having a higher reactivity, and an unsaturated carboxylic acid, are copolymerized.

Specific examples of the compound having an unsaturated group of the formula (3) include allyl (meth)acrylate, 3-allyloxy-2-hydroxypropyl (meth)acrylate, N,N-diallyl (meth)acrylamide, cinnamyl (meth)acrylate, crotonyl (meth) acrylate, and metharyl (meth)acrylate. Among them, allyl (meth)acrylate is particularly preferred.

Specific examples of the compound having an unsaturated group of the formula (4) include vinyl (meth)acrylate, vinyl crotonate, 1-propenyl (meth)acrylate, 1-chlorovinyl (meth) acrylate, 2-phenylvinyl (meth)acrylate, and vinyl (meth) acrylamide.

Among them, vinyl (meth)acrylate is particularly preferred.

The polymer binder (C) having groups of the above formula (3) or (4), which is preferred in the present invention, can be obtained by copolymerizing the above monomer having a group of the formula (3) or (4) with an unsaturated carboxylic acid, preferably acrylic acid or methacrylic acid, to obtain a copolymer having such unsaturated groups. The monomer to be copolymerized, may be copolymerized not only with the unsaturated carboxylic acid but also with other monomers such as an alkyl acrylate, an alkyl methacrylate, acrylonitrile or styrene. The proportion of the compound having a group of the formula (3) or (4) to be copolymerized in the total components of the polymer, is usually from 10 to 90 mol %, preferably from 30 to 80 mol %. If the proportion is less than this range, the image reproducibility tends to be poor, and if it exceeds this range, the developability tends to be poor.

As an example of a polymer binder which has unsaturated bonds of the formulae (3) and (4), a copolymer obtained by a copolymerization reaction of at least a compound of the following formula (5), a compound of the following formula (6) and an unsaturated carboxylic acid, may be mentioned:

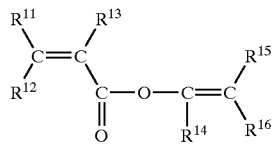
(5)

wherein each of $R^{11}$, $R^{12}$ and $R^{13}$ which are independent of one another, is a hydrogen atom or a methyl group, and each of $R^{14}$, $R^{15}$ and $R^{16}$ which are independent of one another, is a hydrogen atom, an alkyl group, an alkoxy group, a halogen atom or an aryl group,

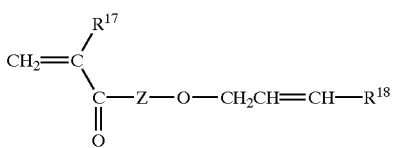
(6)

wherein $R^{17}$ is a hydrogen atom or a methyl group, $R^{18}$ is a hydrogen atom, an alkyl group, an alkoxy group, a halogen atom or an aryl group, and Z is a bivalent linking group having at least three non-metallic atoms in its main chain.

In the formula (5), when $R^4$, $R^{15}$ or $R^{16}$ is an alkyl group, such an alkyl group is preferably of from 1 to 6 carbon atoms, such as a methyl group, an ethyl group, a n-propyl group, an i-propyl group, a n-butyl group, an i-butyl group, a sec-butyl group, a t-butyl group, a n-pentyl group, an i-pentyl group, a sec-amyl group, a t-amyl group or a hexyl group. When it is an alkoxy group, such an alkoxy group is preferably of from 1 to 6 carbon atoms, such as a methoxy group, an ethoxy group, a propoxy group, a butoxy group, a pentyloxy group or a hexyloxy group. When it is a halogen atom, such a halogen may be fluorine, chlorine, bromine or iodine. Particularly preferred is chlorine or bromine. Further, when it is an aryl group, preferred is a phenyl group.

Specific examples of the compound of the formula (5) include the following compounds:

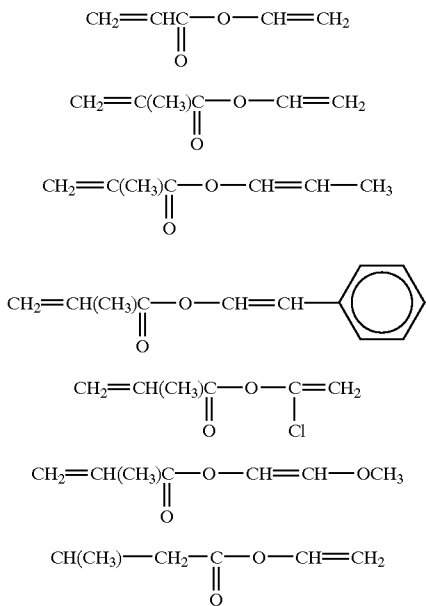

In the formula (6), when $R^{18}$ is an alkyl group, such an alkyl group is preferably of from 1 to 6 carbon atoms, such as a methyl group, an ethyl group, a n-propyl group, an i-propyl group, a n-butyl group, an i-butyl group, a sec-butyl group, a t-butyl group, a n-pentyl group, an i-pentyl group, a sec-amyl group, a t-amyl group or a hexyl group. When it is an alkoxy group, such an alkoxy group is preferably of from 1 to 6 carbon atoms, such as methoxy group, an ethoxy group, a propoxy group, a butoxy group, a pentyloxy group or a hexyloxy group. When it is a halogen atom, such a halogen may be fluorine, chlorine, bromine or iodine. Particularly preferred is chlorine or bromine. Further, when it is an aryl group, preferred is a phenyl group.

Specific examples of Z include

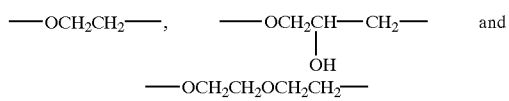

and

Preferred is a compound of the formula (6) wherein Z is

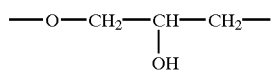

and $R^6$ is a hydrogen atom.

Specific examples of the compound of the formula (6) include the following compounds:

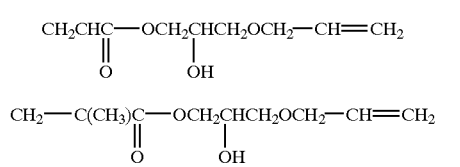

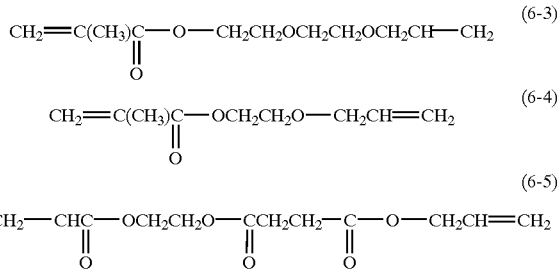

Specific examples of the unsaturated carboxylic acid monomer to be copolymerized with the monomers of the formulae (5) and (6) include acrylic acid, methacrylic acid, maleic anhydride and itaconic acid.

Further, to modify the properties of the photopolymerizable composition, other copolymerizable monomers may be copolymerized to such an extent not to impair the performance. Such copolymerizable monomers include acrylates such as methyl acrylate, ethyl acrylate, n-propyl acrylate, n-butyl acrylate and n-hexyl acrylate, methacrylates such as ethyl methacrylate, n-propyl methacrylate, n-butyl methacrylate and n-hexyl methacrylate, and vinyl compounds such as vinyl chloride, acrylonitrile, styrene and vinyl acetate. In the case of a polymer binder obtained by a copolymerization reaction of at least a compound of the formula (5), a compound of the formula (6) and an unsaturated carboxylic acid, the proportions of the copolymer components are from 5 to 60 mol %, preferably from 20 to 50 mol %, of the compound of the formula (5), from 5 to 50 mol %, preferably 20 to 40 mol %, of the compound of the formula (6), from 2 to 30 mol %, preferably from 5 to 15 mol %, of the unsaturated carboxylic acid monomer, and from 0 to 30 mol %, preferably from 0 to 15 mol %, of other components, based on the total monomer components.

In the foregoing, the main constituting components of the photopolymerizable composition for the photosensitive layer of the present invention have been described in detail. Their suitable proportions are such that, relative to 100 parts by weight of the polymerizable ethylenic monomer, a sensitizing agent among the photopolymerizable initiator is preferably from 0.01 to 20 parts by weight, more preferably from 0.05 to 10 parts by weight, the active agent is preferably from 0.1 to 80 parts by weight, more preferably from 0.5 to 60 parts by weight, and the polymer binder is preferably from 10 to 400 parts by weight, more preferably from 20 to 200 parts by weight.

In addition to the above essential components, the photopolymerizable composition to be used in the present invention may contain still other substances, depending upon the particular purpose. For example, a thermal polymerization preventing agent such as hydroquinone, p-methoxyphenol or 2,6-di-t-butyl-p-cresol, a coloring agent comprising an organic or inorganic dye or pigment, a plasticizer such as dioctyl phthalate, didodecyl phthalate or tricresyl phosphate, a sensitivity improving agent such as a tertiary amine or thiol, or other additives such as a dye precursor, may be incorporated. The amounts of the above additives are preferably such that, relative to 100 parts by weight of the ethylenic monomer, the thermal polymerization preventing agent is at most 2 parts by weight, the coloring agent is at most 20 parts by weight, the plasticizer is at most 40 parts by weight, and the dye precursor is at most 30 parts by weight.

The above-described photopolymerizable composition is diluted with a suitable solvent and coated and dried on a support to form a photosensitive layer. As the support, an aluminum support having the surface roughened, followed by anodic oxidation treatment, can be used. An aluminum plate to be used for a photosensitive lithographic printing plate of the present invention may be subjected to grain treatment by electrolytic surface roughening in nitric acid or in an electrolytic solution composed mainly of nitric acid, and further to anodic oxidation treatment and, if necessary, to hydrophilization treatment.

The electrolytic surface roughening is preferably carried out by immersing the aluminum plate in a bath containing from 0.1 to 0.5 mol/l, preferably from 0.20 to 0.40 mol/l, of nitric acid and electrolytically etching it for from 5 seconds to 3 minutes at a temperature of from 20 to 50° C., preferably from 25 to 40° C., at a current density of from 20 to 200 A/dm$^2$.

The aluminum plate having surface roughening treatment applied thereto, may be subjected to desmatte treatment with an aqueous acidic or alkaline solution, as the case requires. The aluminum plate thus obtained, is usually subjected to anodic oxidation treatment. Particularly preferably, a method of treating it with an electrolyte containing sulfuric acid may be mentioned. The method for anodic oxidation with an electrolyte containing sulfuric acid, can be carried out by a conventional method, such as a method disclosed in e.g. JP-A-58-213894. Specifically, it is carried out, for example, by using sulfuric acid of from 5 to 50 wt %, preferably from 15 to 30%, at a temperature of from 5 to 50° C., preferably from 15 to 35° C. at a current density of from 1 to 60 A/dm$^2$ for from 5 to 60 seconds. Further, treatment with an alkali silicate or hot water, such as sodium silicate treatment, or other surface treatment by dipping in an aqueous solution containing a resin having cationic quaternary ammonium groups or an aqueous polymer compound such as a polyvinyl phosphonic acid, may also be carried out, as the case requires.

The photopolymerizable composition may be coated by a well known method such as dip coating, coating by a rod, spinner coating, spray coating or roll coating.

Further, an oxygen-shileding layer may be formed on the above-mentioned photosensitive layer to prevent a polymerization inhibition action by oxygen. As a specific example of such a layer, a water soluble polymer such as polyvinyl alcohol, polyvinyl pyrrolidone, polyethylene oxide or cellulose may be mentioned. Among them, particularly preferred is the one containing polyvinyl alcohol having a high oxygen gas barrier property.

The light source for exposure applicable to the composition of the present invention is not particularly limited. However, a carbon arc, a high pressure mercury lamp, a xenon lamp, a metal halide lamp, a fluorescent lamp, a tungsten lamp, a halogen lamp, a helium cadmium laser, an argon ion laser, a YAG laser or a helium neon layer may be used particularly suitably.

The photopolymerizable composition of the present invention is subjected to image exposure by such a light source and then developed with an aqueous solution containing a surfactant and an alkali, to form an image on the support. Such an aqueous solution may further contain an organic solvent, a buffering agent, a dye or a pigment. As a suitable alkali agent, an inorganic alkali agent such as sodium silicate, potassium silicate, sodium hydroxide, potassium hydroxide, lithium hydroxide, sodium tertiary phosphate, sodium secondary phosphate, sodium carbonate, potassium carbonate or sodium hydrogencarbonate, or an organic amine compound such as trimethylamine, diethylamine, isopropylamine, n-butylamine, monoethanolamine, diethanolamine or triethanolamine, may be mentioned. These alkali agents may be used alone or in combination as a mixture. The surfactant may, for example, be a nonionic surfactant such as a polyoxyethylene alkyl ether, a polyoxyethylene alkylaryl ether, a polyoxyethylene alkyl ester, a sorbitan alkyl ester or a monoglyceride alkyl ester; an anionic surfactant such as an alkylbenzene sulfonate, an alkylnaphthalene sulfonate, an alkyl sulfate, an alkyl sulfonate or a sulfosuccinate; or an amphoteric surfactant such as an alkylbetaine or an amino acid. Further, as an organic solvent, isopropyl alcohol, benzyl alcohol, ethyl cellosolve, butyl cellosolve, phenyl cellosolve, propylene glycol or diacetone alcohol may, for example, be incorporated, as the case requires.

Now, the present invention will be described in further detail with reference to Examples and Comparative Examples. However, the present invention is by no means restricted to such specific Examples.

Preparation of Binder 2

200 Parts by weight of a copolymer of methyl methacrylate/isobutyl methacrylate/isobutyl acrylate/methacrylic acid =35/20/10/35 mol % (charged ratio) with MW=70,000 (hereinafter referred to simply as "binder 1"), 75 parts by weight of the following alicyclic epoxy-containing unsaturated compound (EP-1), 2.5 parts by weight of p-methoxyphenol, 8 parts by weight of tetrabutylammonium chloride, and 800 parts by weight of propylene glycol monomethyl ether acetate, were charged into a reactor and reacted with stirring in air for 24 hours at 110° C. to obtain a 25 wt % solution of an ethylenic polymer binder (acid value: 60, unsaturated groups were reacted to 60% of the total methacrylic acid component of binder 1, hereinafter referred to simply as "binder 2").

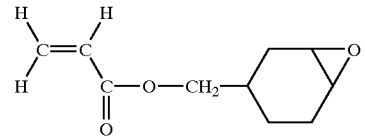

(EP-1)

Preparation of binder 3

Into a 3 l four-necked flask equipped with a stirrer, a reflux condenser and a nitrogen-supplying tube, 107 g of allyl methacrylate, 13 g of methacrylic acid and 1.6 l of ethanol as a solvent for the reaction, were introduced, and heated and stirred in an oil bath of 90° C. To this solution, 1.6 g of azobisisobutyronitrile (AIBN) dissolved in 400 ml of ethanol, was added.

After heating and stirring for 3 hours, the nitrogen-supplying tube was dismounted, and 0.04 g of p-methoxyphenol and 400 ml of propylene glycol monomethyl ether acetate were added, whereupon the bath temperature was raised to 100° C., and heating and stirring were continued for 1 hour. Finally, ethanol was distilled off to obtain a 20 wt % solution of an ethylenic polymer binder (hereinafter referred to as "binder 3") (Mw: 180,000).

Preparation of Binder 4

Into a 3 l four-necked flask equipped with a stirrer, a reflux condenser and a nitrogen-supplying tube, 67 g of vinyl methacrylate, 20 g of methyl methacrylate, 17 g of methacrylic acid and 1.6 l of ethanol as a solvent for the reaction, were introduced, and heated and stirred in an oil bath of 90° C. To this solution, 1.6 g of AIBN dissolved in 400 ml of ethanol, was added.

After heating and stirring for 3 hours, the nitrogen-supplying tube was dismounted, and 0.04 g of p-methoxyphenol and 400 ml of propylene glycol monomethyl ether acetate were added, whereupon the bath temperature was raised to 100° C., and heating and stirring were continued for 1 hour. Finally, ethanol was distilled off to obtain a 18 wt % solution of an ethylenic polymer binder (hereinafter referred to simply as "binder 4") (Mw: 180,000).

Preparation of Binder 5

Into a 3 l four-necked flask equipped with a stirrer, a reflux condenser and a nitrogen-supplying tube, 45 g of vinyl methacrylate, 60 g of 2-hydroxy-3-allyloxypropyl methacrylate (HAOPMA) of the following structure, 8.0 g of acrylonitrile, 13 g of methacrylic acid and 1.6 l of ethanol as a solvent for the reaction, were introduced, and heated and stirred in an oil bath of 80° C. To this solution, 1.6 g of AIBN dissolved in 400 ml of ethanol, was added.

After heating and stirring for 3 hours, the nitrogen-supplying tube was dismounted, and 0.04 g of p-methoxyphenol and 400 ml of propylene glycol monomethyl ether acetate (PGM-AC) were added, whereupon the bath temperature was raised to 100° C., and heating and stirring were continued for 1 hour. Finally, ethanol was distilled off to obtain a 23 wt % solution of an ethylenic polymer binder (hereinafter referred to simply as "binder 5") (Mw: 230,000). The obtained binder solution was diluted with PGM-AC to obtain a 20 wt % solution for use.
HAOPMA

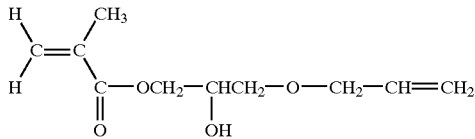

Preparation of an Aluminum Support (1)

An aluminum plate was degreased with 3% sodium hydroxide and then subjected to electrolytic etching for 15 seconds in an nitric acid bath of 18.0 g/l at 25° C. at a current density of 80 A/dm². Then, it was subjected to desmatte treatment for 5 seconds with a 1% sodium hydroxide aqueous solution of 50° C. Then, it was neutralized for 5 seconds in a 10% nitric acid aqueous solution at 15° C. After washing with water, it was subjected to anodic oxidation for 16 seconds in a 30% sulfuric acid bath at 30° C. under a condition of 10 A/dm². Then, it was washed with water and dried to obtain a lithographic printing aluminum plate (hereinafter referred to simply as "support 1").

Preparation of an Aluminum Support (2)

An aluminum plate was degreased with 3% sodium hydroxide and then subjected to electrolytic etching for 15 seconds in a hydrochloric acid bath of 11.5 g/l at 25° C. at a current density of 80 A/dm². Then, it was subjected to desmatte treatment for 5 seconds with a 1% sodium hydroxide aqueous solution of 50° C. Then, it was neutralized for 5 seconds with a 10% nitric acid aqueous solution of 25° C. It was washed with water and then subjected to anodic oxidation for 16 seconds in a 30% sulfuric acid bath at 30° C. under a condition of 10 A/dm². Then, it was washed with water and dried to obtain a lithographic printing aluminum plate (hereinafter referred to simply as support "2").

EXAMPLES 1 to 5 and COMPARATIVE EXAMPLES 1 to 3

On each of the above supports 1 and 2, the following photopolymerizable composition coating fluid 1 was coated by means of a bar coater and dried so that the dried film thickness became 2 g/m². Further, an aqueous polyvinyl alcohol solution was coated thereon by means of a bar coater and dried so that the dried film thickness became 3 g/m², to obtain a photosensitive lithographic printing plate. The obtained photosensitive lithographic printing plate was evaluated with respect to the following items. The results are shown in Table 1.

| Photopolymerizable composition coating fluid 1 | |
| --- | --- |
| Ethylenic monomers identified in Table 1 | total 55 parts by weight |
| Polymer binder identified in Table 1 | 45 parts by weight |
| Compound of the following structure (A-1) | 2.0 parts by weight |
| Titanocene compound of the following structure (B-1) | 10 parts by weight |
| 2-Mercaptobenzothiazole | 5.0 parts by weight |
| Ethyl N,N-dimethylbenzoate | 10 parts by weight |
| Copper phthalocyanine pigment | 3.0 parts by weight |
| Cyclohexanone | 1,090 parts by weight |

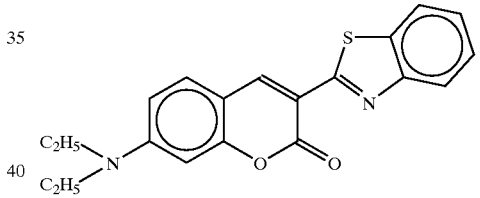

(A-1)

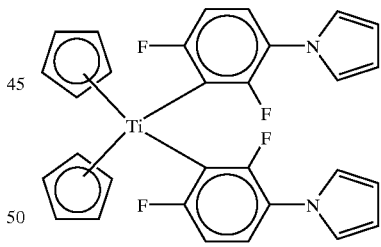

(B-1)

Items for Evaluation

Sensitivity

The photosensitive lithographic printing plate was exposed by means of a diffraction spectral irradiation apparatus (RM-23, manufactured by Narumi K. K.), and then development was carried out by immersing it in an aqueous solution containing 0.8 wt % of anhydrous sodium carbonate and 3 wt % of Pelex NBL (manufactured by Kao Corporation) at 250C for 30 seconds and then rubbing it 7 times with a sponge, whereupon from the height of the cured image thereby obtained, the amount of light energy required for photocuring by light rays of 532 nm, was obtained.

Developability

The photosensitive lithographic printing plate was, without exposure, subjected to development in the same manner as in the case for evaluation of the sensitivity. One droplet of methyl cellosolve was dropped on the obtained sample and dried, and finally, inking was carried out with an developing ink ("SPO-1", tradename, manufactured by Konica K. K.). Here, symbol ○ indicates a level where no ink attached, symbol Δ indicates a level where a fringe appeared at the trace of the methyl cellosolve droplet, and symbol × indicates a level where the ink attached entirely.

Printing Resistance

The photosensitive lithographic printing plate was subjected to scanning exposure by an air-cooled argon laser ("PI-R", tradename, manufactured by Dai Nippon Screen K. K.) with an exposure of 100 $\mu J/cm^2$, and development was carried out in the same manner as for evaluation of the sensitivity. The obtained printing plate was used for printing by "DAIYA-1F-2 Model" (manufactured by Mitsubishi Heavy Industry Co., Ltd.), whereby the number of printed sheets until the image line portion (120 lines, small dots of 4%) became not properly printed, was taken as printing resistance.

Image Reproducibility

A UGRA plate control wedge was closely placed on the photosensitive lithographic printing plate and exposed by a high pressure mercury lamp, and then development was carried out by immersing it in an aqueous solution containing 0.8 wt % of anhydrous sodium carbonate and 3 wt % of Pelex NBL (manufactured by Kao Corporation) at 25°C. for 30 seconds and then rubbing 7 times with a sponge.

The image reproducibility was evaluated by the residual degree of positive fine lines of a circular patch (the finer the reproduced fine lines, the better the image reproducibility).

EXAMPLES 6 and 7 and COMPARATIVE EXAMPLES 4 and 5

The operation was carried out in the same manner as in Examples 1 to 4 and Comparative Examples 1 to 3 except that the following coating fluid 2 was used, and evaluation was carried out. The results are shown in Table 2.

| Photopolymerizable composition coating fluid 2 | |
| --- | --- |
| Ethylenic monomers identified in Table 2 | total 55 parts by weight |
| Polymer binder identified in Table 2 | 45 parts by weight |
| Compound of the following structure (A-2) | 2.0 parts by weight |
| 2,2'-Bis(O-chlorophenyl)-4,4',5,5'-tetra(p-carboethoxyphenyl)-biimidazole | 10 parts by weight |
| 2-Mercaptobenzothiazole | 5.0 parts by weight |
| Ethyl N,N-dimethylbenzoate | 10 parts by weight |
| Copper phthalocyanine pigment | 3.0 parts by weight |
| Cyclohexanone | 1,090 parts by weight |

(A-2)

TABLE 1

| | Example | | | | | Comparative Example | | |
| --- | --- | --- | --- | --- | --- | --- | --- | --- |
| | 1 | 2 | 3 | 4 | 5 | 1 | 2 | 3 |
| Ethylenic monomers (parts by weight) | | | | | | | | |
| 1 | 5 | 5 | 5 | 5 | 11 | 5 | / | / |
| 2 | 25 | 25 | 25 | 25 | 22 | 25 | 30 | 30 |
| 3 | 25 | 25 | 25 | / | 22 | 25 | 25 | / |
| 4 | / | / | / | 25 | / | / | / | 25 |
| Polymer binders (parts by weight) | | | | | | | | |
| 1 | / | / | / | 45 | / | / | / | 45 |
| 2 | 45 | / | / | / | / | 45 | 45 | / |
| 3 | / | 45 | / | / | / | / | / | / |
| 4 | / | / | 45 | / | / | / | / | / |
| 5 | / | / | / | / | 45 | / | / | / |
| Support | 1 | 1 | 1 | 1 | 1 | 2 | 1 | 1 |
| Sensitivity ($\mu J/cm^2$) | 70 | 60 | 60 | 90 | 60 | 100 | 70 | 90 |
| Developability | Good | Good | Good | Good | Good | Good | Bad | Bad |
| Image reproducibility ($\mu m$) | 4 | 4 | 4 | 4 | 4 | 8 | 4 | 4 |
| Printing resistance (× 10,000 sheets) | 15 | 15 | 15 | 12 | 20 | 6 | 15 | 12 |

TABLE 2

| | Example | | Comparative Example | |
| --- | --- | --- | --- | --- |
| | 6 | 7 | 4 | 5 |
| Ethylenic monomers (parts by weight) | | | | |
| 1 | 5 | 5 | 5 | / |
| 2 | 25 | 25 | 25 | 30 |
| 3 | 25 | 25 | 25 | 25 |
| Polymer binders (parts by weight) | | | | |
| 1 | / | 45 | / | / |
| 2 | 45 | / | 45 | 45 |
| Support | 1 | 1 | 2 | 1 |
| Sensitivity ($\mu J/cm^2$) | 60 | 80 | 90 | 60 |
| Developability | Good | Good | Good | Bad |
| Image reproducibility ($\mu m$) | 4 | 4 | 8 | 4 |
| Printing resistance (× 10,000 sheets) | 15 | 12 | 6 | 12 |

In Tables 1 and 2, the symbols (1 to 4) in the column for ethylenic monomers represent the following.

1: PM-2 (compound of the following structure), manufactured by Nippon Kayaku K. K.

2: UA-306H (compound of the following structure), manufactured by Shin Nakamura Kagaku K. K.

3: DPHA (compound of the following structure), manufactured by Nippon Kayaku K. K.

4: SP-4060S (mixture of two types compounds of the following structures)

DPHA

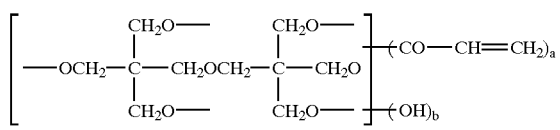

PM-2
A mixture of

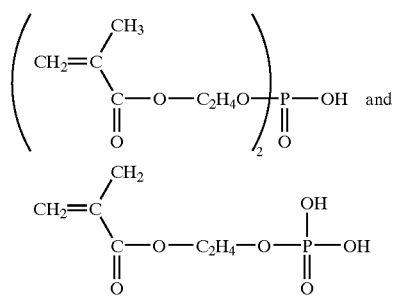

UA-306H

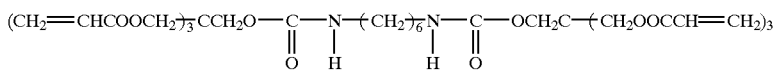

SP-4060S

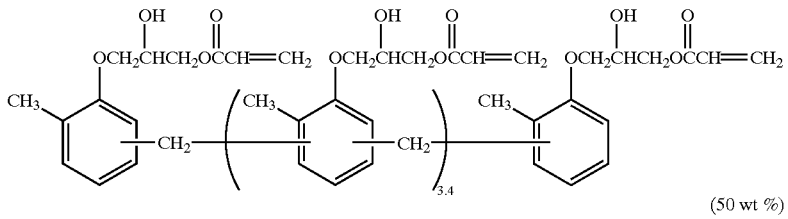

(50 wt %)

Trimethylolpropane triacrylate (TMPTA) (50 wt %)

In Tables 1 and 2, the symbols (1 to 5) in the column for polymer binders represent the above-mentioned binders 1 to 5, respectively.

In Tables 1 and 2, the symbols (1 and 2) in the column for the support represent the above-mentioned supports 1 and 2, respectively.

According to the present invention, it is possible to present a photosensitive lithographic printing plate excellent in all of the printing resistance, sensitivity, image reproducibility and removability of a non-image portion.

What is claimed is:

1. A photosensitive lithographic printing plate having a photosensitive resin layer formed on an aluminum substrate subjected to electrolytic surface roughening in nitric acid or in an electrolyte composed mainly of nitric acid and further to anodic oxidation treatment, wherein the photosensitive resin layer is made of a photopolymerizable composition comprising (A) an addition-polymerizable ethylenically unsaturated bond-containing monomer, (B) a photopolymerization initiator, and (C) a polymer binder, wherein the addition polymerizable ethylenically unsaturated bond-containing monomer (A) contains a phosphate compound having at least one (meth)acryloyl group, wherein the phosphate compound has a structure of the following formula (1A):

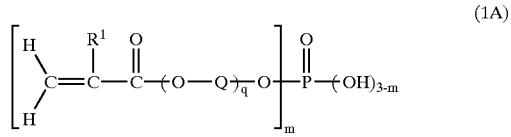

(1A)

wherein $R^1$ is a hydrogen atom or an alkyl group, Q is an alkylene group, q is an integer of from 1 to 10, and m is 1 or 2.

2. A photosensitive lithographic printing plate having a photosensitive resin layer formed on an aluminum substrate subjected to electrolytic surface roughening in nitric acid or in an electrolyte composed mainly of nitric acid and further to anodic oxidation treatment, wherein the photosensitive resin layer is made of a photopolymerizable composition comprising (A) an addition-polymerizable ethylenically unsaturated bond-containing monomer, (B) a photopolymerization initiator, and (C) a polymer binder, wherein the addition polymerizable ethylenically unsaturated bond-containing monomer (A) contains a phosphate compound having at least one (meth)acryloyl group, wherein the polymer binder (C) is one obtained by a copolymerization reaction of at least a monomer of the following formula (5), a monomer of the following formula (6), and an unsaturated carboxylic acid monomer:

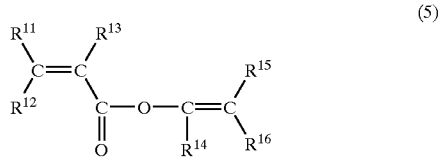

(5)

wherein each of $R^{11}$, $R^{12}$ and $R^{13}$ which are independent of one another, is a hydrogen atom or a methyl group, and each of $R^{14}$, $R^{15}$ and $R^{16}$ which are independent of one another, is a hydrogen atom, an alkyl group, an alkoxy group, a halogen atom or an aryl group,

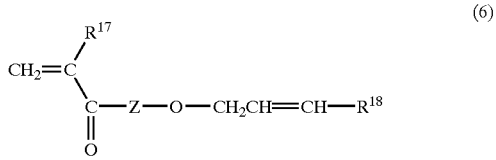

(6)

wherein $R^{17}$ is a hydrogen atom or a methyl group, $R^{18}$ is a hydrogen atom, an alkyl group, an alkoxy group, a halogen atom or an aryl group, and Z is a bivalent linking group having at least three non-metallic atoms in its main chain.

3. The photosensitive lithographic printing plate according to claim 2, wherein in the monomer of the formula (6), Z is

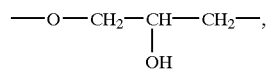

and $R^{18}$ is a hydrogen atom.

4. A photosensitive lithographic printing plate having a photosensitive resin layer formed on an aluminum substrate subjected to electrolytic surface roughening in nitric acid or in an electrolyte composed mainly of nitric acid and further to anodic oxidation treatment, wherein the photosensitive resin layer is made of a photopolymerizable composition comprising (A) an addition-polymerizable ethylenically unsaturated bond-containing monomer, (B) a photopolymerization initiator, and (C) a polymer binder, wherein the addition polymerizable ethylenically unsaturated bond-containing monomer (A) contains a phosphate compound having at least one (meth)acryloyl group, wherein the photopolymerization initiator contains a titanocene.

* * * * *